Figure 1:
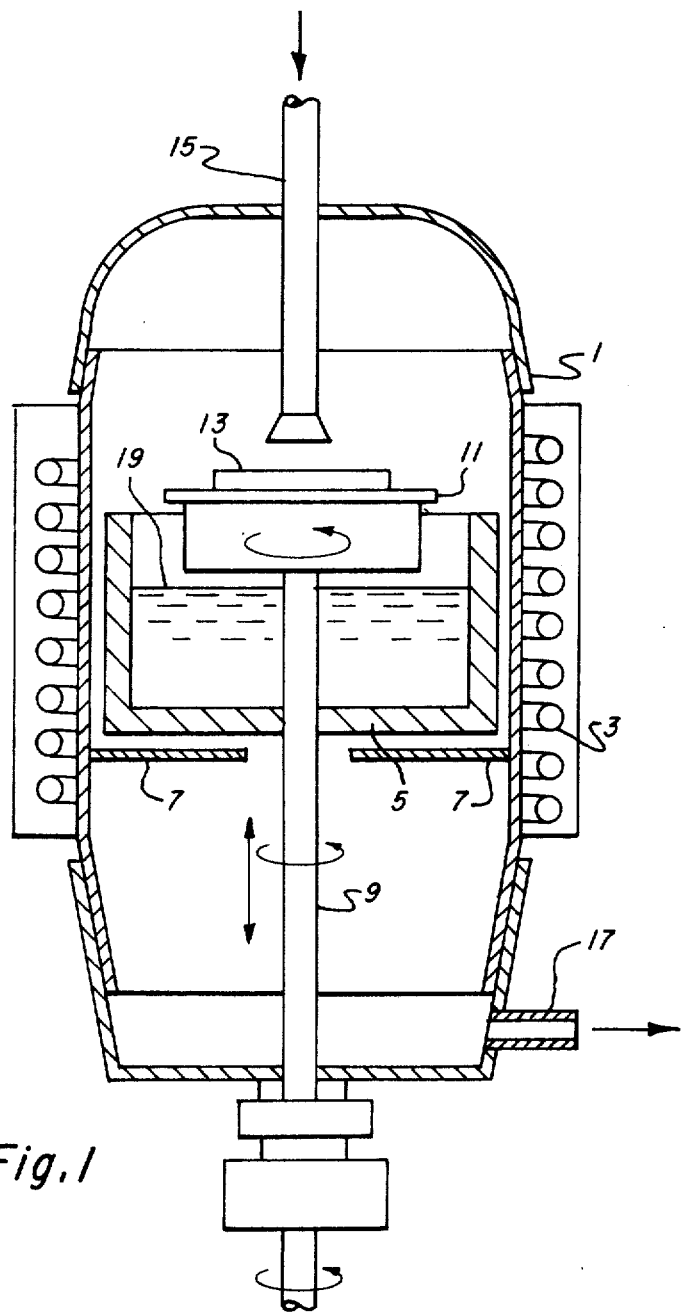

United States Patent [19]

Gartman

[11] 3,933,539

[45] Jan. 20, 1976

[54] SOLUTION GROWTH SYSTEM FOR THE PREPARATION OF SEMICONDUCTOR MATERIALS

[75] Inventor: William W. Gartman, Garland, Tex.

[73] Assignee: Texas Instruments Incorporated, Dallas, Tex.

[22] Filed: Dec. 26, 1973

[21] Appl. No.: 427,861

[52] U.S. Cl............ 148/171; 148/172; 252/62.3 GA
[51] Int. Cl.$^2$............................................ H01L 7/38
[58] Field of Search..................... 148/171–173; 117/201; 252/62.3 GA

[56] References Cited
UNITED STATES PATENTS

| | | | |
|---|---|---|---|
| 3,546,032 | 12/1970 | Basart | 148/171 |
| 3,647,578 | 3/1972 | Barnett et al. | 148/171 |
| 3,677,836 | 7/1972 | Lorenz | 148/171 |
| 3,755,013 | 8/1973 | Hollan | 148/172 |

*Primary Examiner*—G. Ozaki
*Attorney, Agent, or Firm*—Harold Levine; James T. Comfort; Gary C. Honeycutt

[57] ABSTRACT

The disclosure relates to a method and system for providing epitaxial solution growth of Group III-V compounds, one of which is gallium arsenide onto a substrate wherein the epitaxially grown layer is of uniform thickness over the substrate and the dopant is uniformly distributed throughout the epitaxially grown layer. This is accomplished, in accordance with one embodiment of the invention, by passing a hydrogen stream containing arsenic chloride vapor over the surface of a gallium arsenide-gallium melt wherein the substrate is immersed. The arsenic chloride is reduced to elemental arsenic and HCl, the latter reacting with the gallium to form gallium chloride which is volatile at the operating temperatures and is removed from the system. A saturated system of gallium arsenide in gallium is produced, some of the excess gallium arsenide depositing epitaxially on the substrate in solution. Any dopant would be placed in the melt and deposit along with the gallium arsenide on the substrate. The substrate is continually rotated to maintain substantially constant temperatures at the substrate and the immediately surrounding region.

In accordance with a second embodiment of the invention, the substrate is lowered into a gallium melt saturated with or having an excess of gallium arsenide. When the substrate reaches the melt temperature, it is then externally cooled and maintained at a constant temperature with rotation in the melt, the substrate temperature being slightly below the melt temperature. Gallium arsenide will thus deposit from the melt onto the substrate, the gallium arsenide being continually replenished in the melt. A dopant can also be placed in the melt. The temperature differential between substrate and melt is maintained constant along the entire substrate.

24 Claims, 2 Drawing Figures

SOLUTION GROWTH SYSTEM FOR THE PREPARATION OF SEMICONDUCTOR MATERIALS

This invention relates to the solution growth of Group III-V semiconductor materials onto a substrate and, more specifically, to a method and apparatus for the growth in solution of Group III-V semiconductor material onto a substrate wherein the substrate temperature can be maintained constant during growth and the temperature differential between a melt containing a solvent and the material to be grown and the substrate is maintained constant.

The application of solution growth epitaxy to the preparation of semiconductor compounds has become increasingly useful. However, during the process of developing solution growth techniques, several problems have been encountered which severely affect material quality. One of the primary problems which has been observed when standard solution growth techniques are used is the variation of deposit thicknesses across a single substrate. This can be caused either by "aftergrowth" which results from the inability to remove the saturated melt solution from the surface of the deposit prior to cool-down, or by slight variations in temperature throughout the melt during the growing cycle. Most solution growth techniques rely on variations of melt temperatures in order to achieve epitaxial growth. Since doping level in an epitaxial layer is a function of both growth rate and growth temperature, most solution grown epitaxial layers have doping gradients which can severely affect device performance. Solution growth techniques which rely on differential temperature variations can also induce variations in deposit composition when this technique is used to prepare mixed crystals such as $Ga_xIn_{1-x}As$.

In accordance with the present invention and with the above noted problems in mind, there has been developed a process of producing solution growth of Group III-V semiconductor material which utilizes a constant temperature growth technique. In accordance with this process, there are produced epitaxial deposits of the Group III-V compound which have uniform deposit thicknesses and are free of doping gradients. The solution growth processes in accordance with the present invention rely on the principle of super saturating a suitable solvent such as gallium, indium, or the like and the resulting recrystallization of a single crystalline epitaxial deposit on a suitable substrate.

Briefly, the above is accomplished in accordance with one embodiment of the present invention by passing a hydrogen stream containing arsenic chloride vapor over the surface of a gallium arsenide/gallium melt wherein the substrate is immersed. The arsenic chloride is reduced to elemental arsenic and HCl gas, the latter reacting with the gallium to form gallium chloride which is volatile at the operating temperatures and is removed from the system. A saturated system of gallium arsenide in gallium is produced, some of the excess gallium arsenide depositing epitaxially on the substrate in solution. Any dopant would be placed in the melt and the deposit along with the gallium arsenide on the substrate. The substrate is continually rotated to maintain substantially constant temperatures at the substrate and the immediately surrounding region.

In accordance with a second embodiment of the invention, the substrate is lowered into a gallium melt having an excess of gallium arsenide. When the substrate reaches the melt temperature, it is then externally cooled and maintained at a constant temperature with rotation in the melt, the substrate temperature being slightly below the melt temperature. Gallium arsenide will thus deposit from the melt onto the substrate, the gallium arsenide being continually replenished in the melt. A dopant can also be placed in the melt. The temperature differential between substrate and melt is maintained constant along the entire substrate.

By means of slight variations of the above system, as would be apparent to those skilled in the art, almost all Group III-V, materials can be deposited in the manner disclosed, including ternary Group III-V materials.

It is therefore an object of this invention to provide the process of solution growth of Group III-V semiconductor material utilizing constant temperature in the growth region.

It is a further object of this invention to provide a method of solution growth of Group III-V semiconductor material capable of providing uniform deposit thicknesses of the deposited material and which are free of doping gradients.

It is yet a further object of this invention to provide a system for solution growth of Group III-V semiconductor material wherein the Group III-V material is deposited by providing a supersaturated condition of the Group III-V material to be deposited in the vicinity of the deposit receiving substrate from a suitable solvent.

Figure 2:
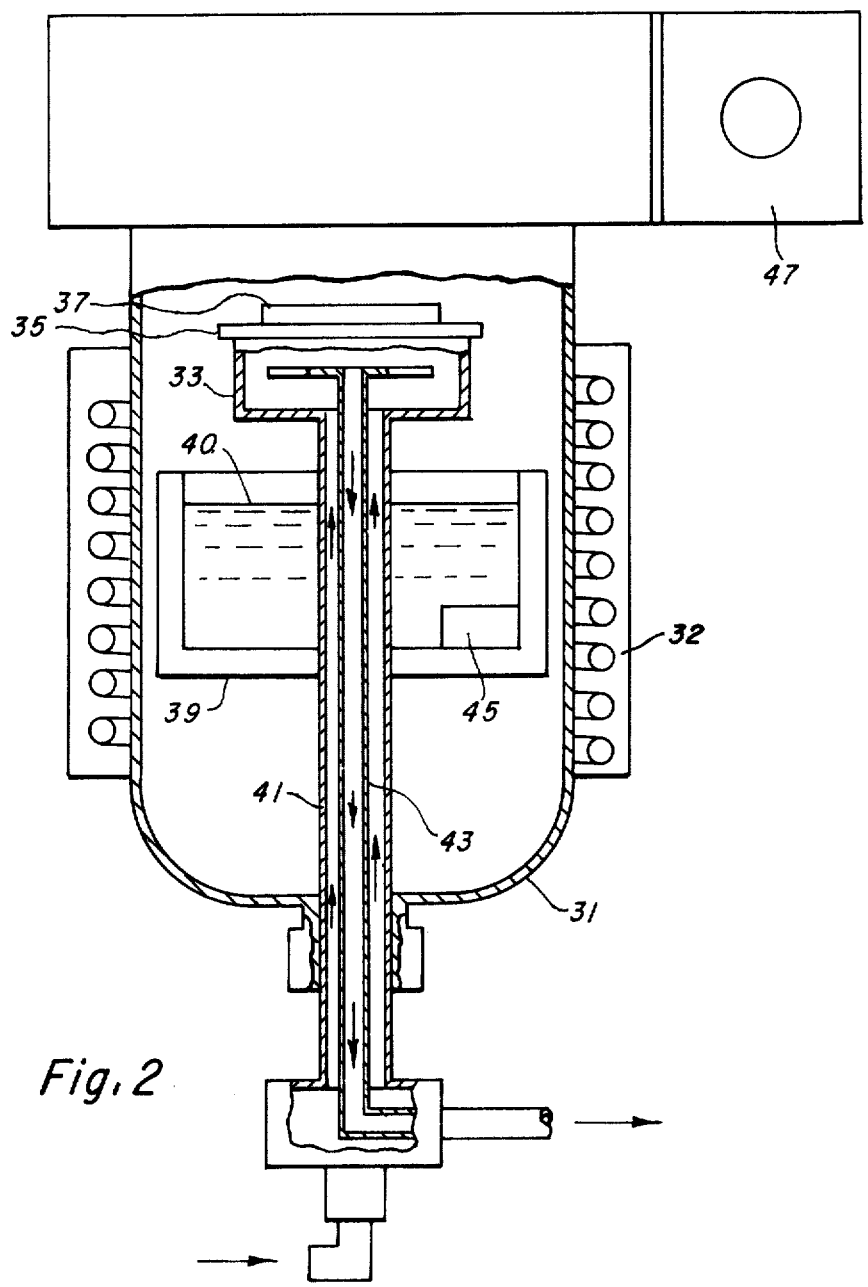

The above objects and still further objects of the invention will immediately become apparent to those skilled in the art after consideration of the following preferred embodiments thereof, which are provided by way of example and not by way of limitation, wherein:

FIG. 1 is a schematic diagram of a constant temperature solution epitaxial system for Group III-V compound deposition in accordance with a first embodiment of the present invention; and FIG. 2 is a system showing a second embodiment of the invention wherein variable temperature solution growth is available.

Referring now to FIG. 1, there is shown a first embodiment of the system for solution growth of Group III-V semiconductor materials in accordance with the present invention. The system includes a furnace 1 having a heater 3 which can be of any appropriate type such as a resistance or RF heater. The furnace can be formed of graphite or other appropriate material as is well-known in the art. A crucible 5 of appropriate material to handle the materials to be melted therein without contamination is provided within the furnace 1, and supported on supports 7 therein. A rotating seed holder 9 passes into the furnace 1 and through the base of the crucible 5 with which it makes a sealing fit so that melt within the crucible will not pass through the opening in the crucible. Platform 11 is positioned on the top of the rotating seed holder, the substrate 13 being positioned on the platform 11. An inlet channel 15 is provided into the furnace 1 and an exhaust channel 17 is provided at the base of the furnace.

The rotating seed holder is capable of rotation in a clockwise or counter clockwise direction, the clockwise direction being shown in FIG. 1. The rotating seed holder 9 is also capable of being moved in a vertical direction as shown by the arrows so that the platform 11 and substrate 13 can be dropped within the confines of the crucible 5 and beneath a melt 19 therein. The melt in the preferred embodiment herein is gallium saturated with gallium arsenide though it should be appreciated by those skilled in the art that other appropriate materials can be used. In this case, the gallium is utilized as a solvent for the gallium arsenide and as stated above, other appropriate solvents and Group III–V materials can be provided to perform the melt. In addition, if desired, appropriate dopants can be supplied into the melt 19, these taking the form of materials such as, but not limited to, tin, tellurium, sulphur, silicon, germanium, selenium, and the like.

The melt 19 is heated, preferably to a temperature of about 950°C., or preferably somewhere in the range of 800° to 1100°C. though it is possible that some materials do work in the range of as low of 500°C. up to 1200°C. When the melt has been heated up to the appropriate temperature, the rotating seed holder 9 is lowered so that the platform or substrate holder 11 and 13 are completely immersed in the melt. Arsenic trichloride and hydrogen gases are then passed into the inlet 15 so that they are within the furnace 1. Due to the heat within the furnace, the arsenic trichloride and hydrogen react to form elemental arsenic and hydrogen chloride gas, the hydrogen chloride gas reacting with the gallium in the melt under the heat to form gallium chloride gas which is passed off along with the hydrogen which is formed through the exhaust 17. This depletion of gallium from the gallium arsenide saturated gallium melt 19 causes an over-abundance of gallium arsenide, or a supersaturated condition, this gallium arsenide then depositing on the substrate 13 to form an epitaxially deposited layer from solution thereon of gallium arsenide. Due to the rotation of the substrate by means of the rotating seed holder 9, the solution is mixed and provides normalization from any slight variations in temperature within the melt. When the deposition cycle is complete, the substrate crystal 13 is raised above the surface of the melt 19 and the rotation speed is increased in order to remove any excess gallium, thus preventing aftergrowth.

It can be seen that there is provided a solution epitaxial deposition of gallium arsenide on a crystal substrate which provides the objects of the invention above-enumerated in simple manner.

It should be noted that the ratio of gallium to arsenic in the melt affects the manner in which the dopant enters the lattice structure. If the melt is gallium rich, an abundance of arsenic sites is available and the silicon will deposit on an arsenic site and act as a donor and silicon is used as the dopant. On the other hand, if the melt is arsenic rich, the silicon dopant will locate a gallium site and act as an acceptor. It can therefore be seen that a single dopant can be used to provide either p-type or n-type material using silicon or other Group IV dopants as is well-known in the art.

It should further be noted that gallium wets gallium arsenide and, accordingly, when the slice is covered with excess gallium thereon, this will precipitate on the surface of the wafer. This is undesirable and, in the prior art, this was removed by scraping, cleaning, or the like, which was very undesirable and costly. This cleaning step is eliminated by the above-noted rotation of the seed holder 11 above the surface of the melt after completion of the deposition step as noted.

Referring now to FIG. 2, there is shown a system setting forth the second embodiment of the present invention. The system includes a furnace 31 having a heater 32 therearound which can be of the same type as described previously with regard to the embodiment of FIG. 1. A seed holder 33 is provided which has a hollow interior, a pedestal 35 which can be made of carbon being positioned thereon, and the substrate 37 upon which deposition is to take place is placed on and secured to the carbon pedestal. A crucible 39 which will contain a melt 40 is positioned within the furnace 31 and an inlet pipe 41 and an exhaust pipe 43 pass through the bottom of the furnace 31 and up to the seed holder 33 in order to be able to pass fluids into the seed holder and back out again as will be described in detail hereinbelow. In addition, the pipes 41 and 43 are secured to the seed holder in such a way that vertical movement thereof will cause the seed holder to move in an upward and downward direction, the inlet and exhaust also being rotatable to provide a rotary motion to the seed holder 33 in the same manner as was described with regard to FIG. 1. The crucible 39 is filled with a gallium melt 40 and an excess of solid gallium arsenide is positioned at the base of the crucible as shown at 45. It should be understood that other appropriate solvents can be used in place of gallium and other appropriate deposition material can be used in place of gallium arsenide as discussed hereinabove with regard to the embodiment of FIG. 1.

The gallium 40 is heated to a temperature preferably in the range of 1100°C. and, in any event, greater than the temperature of the substrate 37. Gallium arsenide from the solid gallium arsenide mass 45 will dissolve into the gallium melt until a saturated solution of gallium arsenide and gallium is provided at the melt temperature. The seed holder 33 is then lowered so that the seed holder 33, pedestal 35 and substrate 37 are completely immersed within the melt 40. A cooling fluid is then passed into the inlet pipe 41, this taking the form of air, nitrogen, water or other appropriate cooling material, this material going into the inlet 41 and to the base of the seed holder 33 and then out through the exhaust 43. In this manner, the temperature of the pedestal 35 and therefore of the substrate 37 can be controlled. This temperature is normally controlled in the range of 500° to 1200°C. for the substrate as is predetermined. This will be explained in more detail hereinbelow. Also, while the seed holder is being lowered into the melt, it is rotated to break any crust which may form on the surface of the melt. The seed holder 33, pedestal and substrate 37 are lowered into the melt and retained there until an equilibrium temperature condition is obtained, whereupon the substrate 37 is cooled to the desired temperature by means of the fluid flowing in the pipes 41 and 43 as above described due to the transfer of heat from the seed holder through the pedestal to the substrate. When the temperature of the substrate 37 goes below the temperature of the melt, and the liquid in the vicinity of the substrate 37 becomes saturated, gallium arsenide will deposit out from the melt onto the substrate 37. Since there is an excess of gallium arsenide 45 in the form of a solid block at the base of the crucible 39, as gallium is removed from the melt and deposited onto the substrate 37, additional gallium arsenide will dissolve from the block 45 and retain the saturated condition of the melt. In addition, due to rotation of the seed holder 33 in the melt 40, a temperature equilibrium is maintained and the deposition rate along the entire substrate is constant.

While the temperature of the melt has been stated to be preferably in the vicinity of 1100°C., it is merely necessary to maintain the temperature of the melt approximately 10°C. above the temperature of the substrate and to keep the temperatures of both the melt and the substrate as low as possible in order to perform the desired end result. This is because at higher temperatures it is possible that impurities from the crucible 39 may dissolve out and deposit onto the substrate 37 along with the gallium arsenide and any dopant which may also be in the melt as described in detail hereinabove with regard to the embodiment of FIG. 1. It is also known to those skilled in the art that in the case of a Group IV dopant, the conductivity type of the deposited substrate will be temperature dependent and this will dictate the temperatures at which the deposition is to take place.

As a further feature, an airlock 47 can be provided to achieve the ability of operation of the chamber in a vacuum with inert gas or the like. In this manner, substrates on which deposition has taken place can be removed through the airlocks and new wafers or substrates can be placed on the pedestal 35 and the process repeated as above described. This is possible because the system is not required to be opened during removal of completed substrates and replacement of new substrates.

It can be seen that there has been provided systems wherein Group III–V compounds can be deposited on a semiconductor substrate having uniform thickness of the deposited layer and uniform distribution of dopants. In addition, the requirement of removing undesirable materials from the surface of the wafer or substrate on which deposition has taken place, is substantially eliminated by the rotational feature of the feed holder.

Although the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of solution growth of a Group III–V semiconductor material onto a substrate comprising the steps of
   a. providing a melt comprising a saturated solution of a Group III–V semiconductor compound in a Group III solvent for said compound,
   b. lowering a substrate into said melt,
   c. passing a vapor stream of a halide of said Group V element in contact with the melt and withdrawing a predetermined amount of said solvent from said melt as Group III halide vapor to cause deposition of said compound onto said substrate; and
   d. maintaining a uniform, constant temperature throughout the melt during the complete deposition period.

2. A method as set forth in claim 1 wherein said melt is composed of a gallium solvent and gallium arsenide.

3. A method as set forth in claim 2, wherein said melt further includes a dopant.

4. A method as set forth in claim 3, further including the step of rotating said substrate after lowering into said melt.

5. A method as set forth in claim 4, further including after step (c) the step of removing said substrate from said melt and rotating said substrate to remove excess melt therefrom.

6. A method as set forth in claim 5, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

7. A method as set forth in claim 4, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

8. A method as set forth in claim 3, further including after step (c) the step of removing said substrate from said melt and rotating said substrate to remove excess melt therefrom.

9. A method as set forth in claim 8, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

10. A method as set forth in claim 3, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

11. A method as set forth in claim 2, further including the step of rotating said substrate after lowering into said melt.

12. A method as set forth in claim 11, further including after step (c) the step of removing said substrate from said melt and rotating said substrate to remove excess melt therefrom.

13. A method as set forth in claim 12, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

14. A method as set forth in claim 11, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

15. A method as set forth in claim 2, further including after step (c) the step of removing said substrate from said melt and rotating said substrate to remove excess melt therefrom.

16. A method as set forth in claim 15, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

17. A method as set forth in claim 2, wherein said gallium is removed by the step of reacting hydrogen with arsenic chloride gas in the vicinity of said melt whereby HCl gas is formed and reacts with said gallium to form gallium chloride gas and removing the gases from the vicinity of said melt.

18. A method as set forth in claim 1, wherein said melt further includes a dopant.

19. A method as set forth in claim 18, further including the step of rotating said substrate after lowering into said melt.

20. A method as set forth in claim 19, further including after step (c) the step of removing said substrate from said melt and rotating said substrate to remove excess melt therefrom.

21. A method as set forth in claim 18, further including after step (c) the step of removing said substrate from said melt and rotating said substrate to remove excess melt therefrom.

22. A method as set forth in claim 1, further including the step of rotating said substrate after lowering into said melt.

23. A method as set forth in claim 22, further including after step (c) the step of removing said substrate from said melt and rotating said substrate to remove excess melt therefrom.

24. A method as set forth in claim 1, further including after step (c) the step of removing said substrate from said melt and rotating said substrate to remove excess melt therefrom.

* * * * *